United States Patent
Pahk

(10) Patent No.: US 10,431,461 B2
(45) Date of Patent: Oct. 1, 2019

(54) DEPOSITION APPARATUS

(71) Applicant: SAMSUNG DISPLAY CO., LTD., Yongin-si, Gyeonggi-do (KR)

(72) Inventor: Jaebum Pahk, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/950,344

(22) Filed: Apr. 11, 2018

(65) Prior Publication Data

US 2018/0233364 A1    Aug. 16, 2018

Related U.S. Application Data

(62) Division of application No. 14/973,120, filed on Dec. 17, 2015, now Pat. No. 9,960,041.

(30) Foreign Application Priority Data

Apr. 10, 2015   (KR) .................. 10-2015-0051136

(51) Int. Cl.
| | | |
|---|---|---|
| H01L 21/22 | (2006.01) | |
| C23C 14/22 | (2006.01) | |
| C23C 14/24 | (2006.01) | |

(52) U.S. Cl.
CPC ............ *H01L 21/22* (2013.01); *C23C 14/228* (2013.01); *C23C 14/243* (2013.01)

(58) Field of Classification Search
USPC .................. 118/726, 712, 724, 666, 667, 725
See application file for complete search history.

(56) References Cited

U.S. PATENT DOCUMENTS

| | | |
|---|---|---|
| 2003/0101937 A1 | 6/2003 | Van Slyke et al. |
| 2009/0038549 A1 | 2/2009 | Englert |
| 2010/0269755 A1 | 10/2010 | Nagata |
| 2011/0146579 A1 | 6/2011 | Seo et al. |
| 2014/0109829 A1 | 4/2014 | Kim et al. |
| 2014/0131667 A1* | 5/2014 | Chang .................... H01L 51/56 257/40 |
| 2014/0290579 A1 | 10/2014 | Lin et al. |

FOREIGN PATENT DOCUMENTS

| | | |
|---|---|---|
| KR | 10-2003-0043775 A | 6/2003 |
| KR | 10-2006-0081943 A | 7/2006 |
| KR | 10-2012-0084390 A | 7/2012 |
| KR | 10-2014-0119654 A | 10/2014 |
| KR | 10-2014-0128531 A | 11/2014 |

* cited by examiner

*Primary Examiner* — Yewebdar T Tadesse
(74) *Attorney, Agent, or Firm* — Lee & Morse, P.C.

(57) ABSTRACT

A deposition apparatus including a crucible to receive the deposition material and in which a deposition material is evaporated; a linear deposition source having a sprayer to spray the evaporated deposition material; a first connection portion and a second connection portion spaced apart from each other by a predetermined interval, the first connection portion and the second connection portion connecting the linear deposition source to the crucible at an upper surface of the crucible; and a heater in the crucible to apply heat to the deposition material, wherein the upper surface of the crucible has a first convex portion and a second convex portion successively formed between the first connection portion and the second connection portion.

2 Claims, 10 Drawing Sheets

DEPOSITION APPARATUS

CROSS-REFERENCE TO RELATED APPLICATIONS

This is a divisional application based on pending application Ser. No. 14/973,120, filed Dec. 17, 2015, the entire contents of which is hereby incorporated by reference.

Korean Patent Application No. 10-2015-0051136, filed on Apr. 10, 2015, in the Korean Intellectual Property Office, and entitled: "Deposition Apparatus," is incorporated by reference herein in its entirety.

BACKGROUND

1. Field

Embodiments relate to a deposition apparatus.

2. Description of the Related Art

An organic light emitting display device may be used to form a display apparatus for a mobile apparatus such as a smartphone, a tablet personal computer (PC), an ultra slim notebook computer, a digital camera, a video camera, a personal digital assistant (PDA) or an electronic/electric product such as an ultra slim profile television (TV). Thus, the organic light emitting display device has been in the limelight. The organic light emitting display device may be formed by using a deposition method whereby a deposition material is evaporated and generated gas molecules are adhered to a glass substrate to form a layer on the glass substrate.

SUMMARY

Embodiments are directed to a deposition apparatus.

The embodiments may be realized by providing a deposition apparatus, including a crucible to receive the deposition material and in which a deposition material is evaporated; a linear deposition source having a sprayer to spray the evaporated deposition material; a first connection portion and a second connection portion spaced apart from each other by a predetermined interval, the first connection portion and the second connection portion connecting the linear deposition source to the crucible at an upper surface of the crucible; and a heater in the crucible to apply heat to the deposition material, wherein the upper surface of the crucible has a first convex portion and a second convex portion successively formed between the first connection portion and the second connection portion.

The crucible may extend lengthwise in one direction, and the first convex portion and the second convex portion may each include a first inclination portion inclined at a first angle with respect to the one direction, and a second inclination portion inclined at a second angle with respect to the one direction.

The crucible may include a first joining portion that connects the first convex portion with the second convex portion, the first joining portion having a curved shape.

The crucible may include a second joining portion that connects the first inclination portion with the second inclination portion, the second joining portion having a curved shape.

The heater may include a plurality of first heaters and a plurality of second heaters, the plurality of first heaters may extend in one direction and may be arranged next to each other to be separated from each other by a predetermined pitch, and the plurality of second heaters may extend in a direction perpendicular to the one direction and may be arranged next to each other to be separated from each other by a predetermined pitch.

The apparatus may further include a temperature detector in the crucible; and a temperature controller to transmit a temperature control signal to a power source that supplies power to the heater according to temperature of the crucible detected by the temperature detector.

The apparatus may further include a transfer portion to move the linear deposition source and the crucible in a first direction.

A substrate onto which the deposition material is sprayed from the linear deposition source may have a large size.

The embodiments may be realized by providing a deposition apparatus including a crucible to receive the deposition material and in which a deposition material is evaporated; a linear deposition source having a sprayer to spray the evaporated deposition material; a first connection portion and a second connection portion spaced apart from each other by a predetermined interval, the first connection portion and the second connection portion connecting the linear deposition source to the crucible at an upper surface of the crucible; and a heater in the crucible to apply heat to the deposition material, wherein the heater faces the upper surface of the crucible and includes a first concave portion and a second concave portion successively formed between the first connection portion and the second connection portion.

The crucible may extend lengthwise in one direction, and the first concave portion and the second concave portion may each include a first inclination heater portion inclined at a first angle with respect to the one direction, and a second inclination heater portion inclined at a second angle with respect to the one direction.

The first inclination heater portion and the second inclination heater portion may each include a plurality of first heaters and a plurality of second heaters, the plurality of first heaters may extend in one direction and may be arranged next to each other to be separated from each other by a predetermined interval, and the plurality of second heaters may extend in a direction perpendicular to the one direction and may be arranged next to each other to be separated from each other by a predetermined interval.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
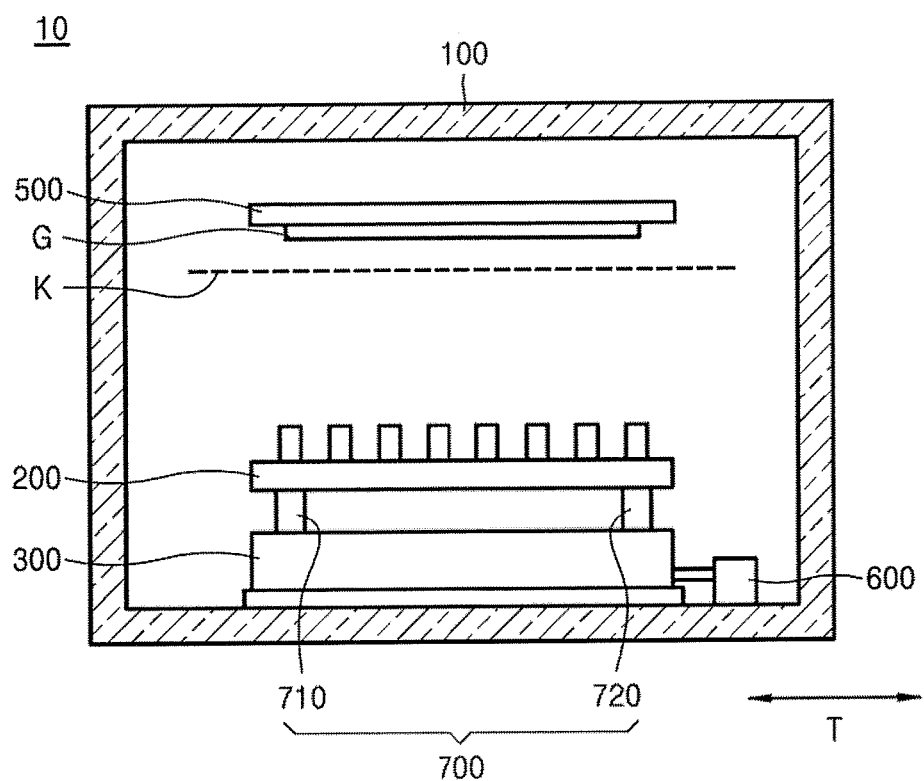
FIG. 1A illustrates a schematic view of a deposition apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "includes," "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

Figure 1B:
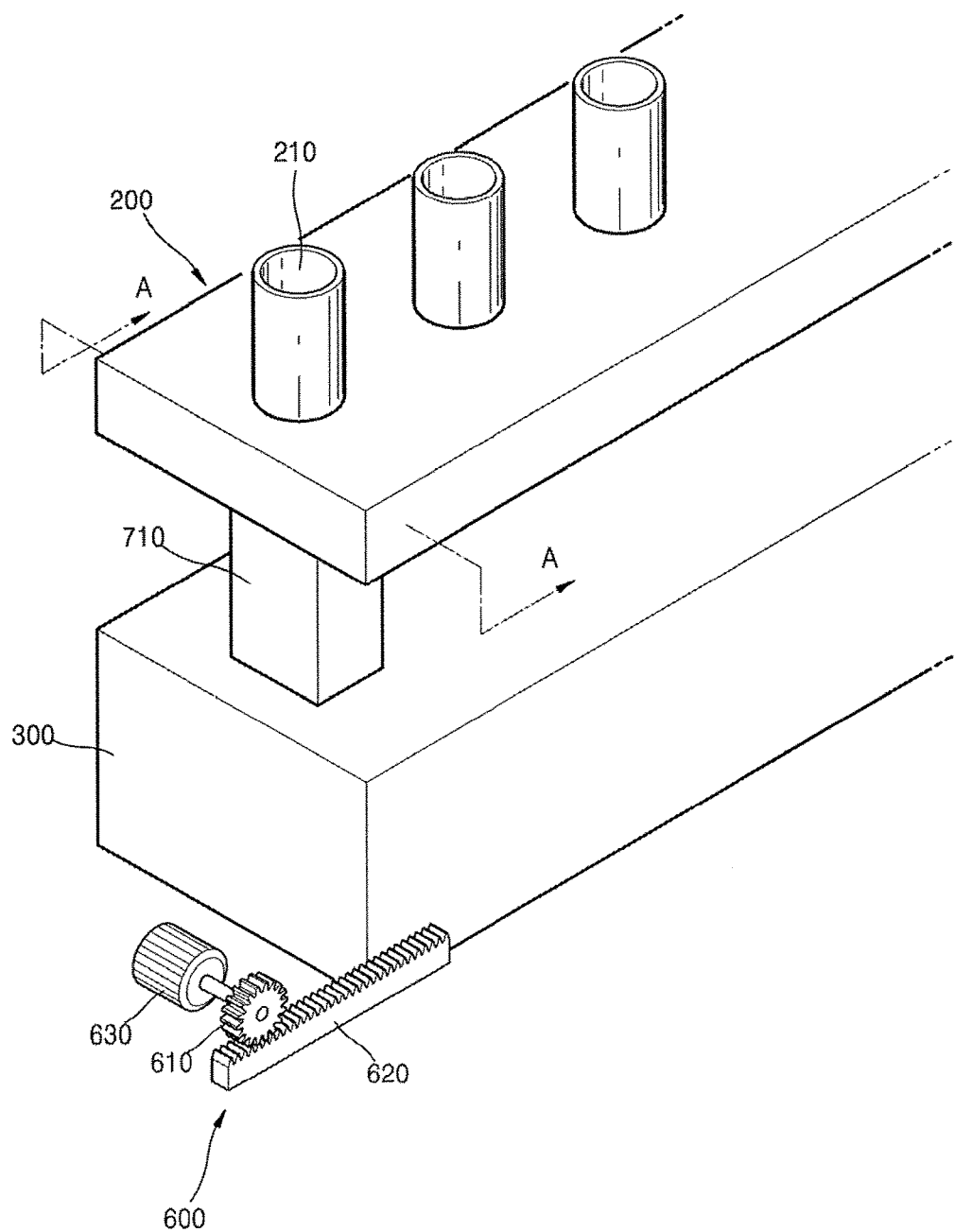
FIG. 1B illustrates a perspective view of a linear deposition source and an evaporator of FIG. 1A.
Figure 2:
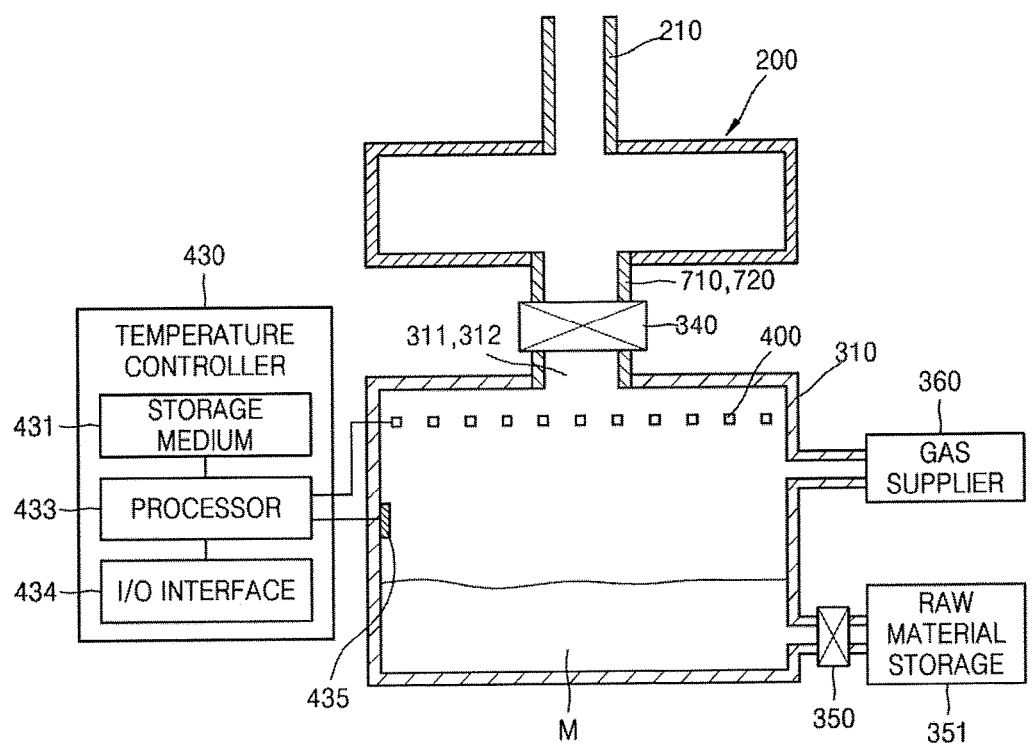
FIG. 2 illustrates a cross-sectional view taken along a line A-A of FIG. 1B.

FIG. 1A illustrates a schematic view of a deposition apparatus 10 according to an exemplary embodiment. FIG. 1B illustrates a perspective view of an evaporator and a linear deposition source of the deposition apparatus 10 of FIG. 1A. FIG. 2 illustrates a cross-sectional view taken along a line A-A of FIG. 1B.

Referring to FIGS. 1A, 1B, and 2, the deposition apparatus 10 according to an exemplary embodiment may include, e.g., a process chamber 100, a linear deposition source 200 inside the process chamber 100, and an evaporator 300 at a lower side of the linear deposition source 200. In an implementation, a substrate holder 500 may be positioned to face the linear deposition source 200.

The process chamber 100 may provide a space for performing a deposition process, and may further include a carrying port for carrying in/out a substrate G and an exhaust terminal connected with a vacuum pump in order to control the pressure of the inside of the process chamber 100 and exhaust a deposition material not deposited on the substrate G. In an implementation, the process chamber 100 may further include a mask assembly K positioned between the linear deposition source 200 and the substrate holder 500 and including a plurality of slits so that the deposition material may be deposited on the substrate G in a predetermined pattern.

The substrate holder 500 may be for seating a substrate G carried into the inside of the process chamber 100, and may further include a separate fixing member for fixing the substrate G during a deposition process.

In an implementation, the deposition apparatus 10 according to an exemplary embodiment may include the linear deposition source 200 positioned in a lower portion of the process chamber 100 and the substrate holder 500 may be positioned in the upper portion of the process chamber 100 to allow the substrate G to be fixed by the substrate holder 500 such that the substrate G is horizontal with respect to the ground or bottom of the process chamber 100. In an implementation, the linear deposition source 200 may be positioned on a lateral surface of one side of the process chamber 100, and the substrate holder 500 may be positioned on a lateral surface of another side of the process chamber 100 to allow the substrate G fixed to the substrate holder 500 to have an angle of about 70-110° with respect to the ground or bottom of the process chamber 100, so that substrate deflection by gravity may be reduced and/or prevented.

The linear deposition source 200 may facilitate forming a layer on the substrate G using the deposition material by spraying the deposition material (transferred from the evaporator 300) onto the substrate G. The linear deposition source 200 may have a length (e.g., a longer side) extending in one direction, e.g., a first direction T. A plurality of sprayers 210 may be disposed on an upper portion of the linear deposition source 200. The plurality of sprayers 210 may be disposed or aligned in parallel or linearly with each other with an equal interval or pitch such that the length direction of the sprayers 210 may be approximately perpendicular to a progression direction of the substrate G. For example, the length direction of each sprayer 210 or of the linear deposition source may have a length approximately equal to the width of the substrate G, and the sprayers 210 may be formed in the same shape and structure. In an implementation, a layer forming process may be successively performed on the substrate G by gas molecules sprayed from the plurality of sprayers 210 in the inside of the process chamber 100.

The deposition apparatus 10 may further include a transfer portion 600. The transfer portion 600 may move the linear deposition source 200 and the evaporator 300 in the first direction T. The transfer portion 600 may include, e.g., a ball screw 610, a motor 630 for rotating the ball screw 610, and a guide 620 for controlling a movement direction of the linear deposition source 200 and the evaporator 300. As the linear deposition source 200 and the evaporator 300 are moved by the transfer portion 600, the deposition apparatus 10 may allow a deposition material M to be deposited on a wider area. Accordingly, the substrate G onto which the deposition material M is sprayed from the linear deposition source 200 may be formed to have a large size.

The evaporator 300 may be or may include a heating portion for evaporating a deposition material. The evaporator 300 may include a crucible 310 and a plurality of heaters 400. The crucible 310 is a storage member for storing different kinds of deposition materials M as raw materials for forming a layer. A space for receiving the deposition material M may be formed inside the crucible 310 according to an exemplary embodiment, and a plurality of openings 311 and 312 may be disposed at ends, e.g., both ends, of the crucible 310 so that an evaporated deposition material M may move to the linear deposition source 200 via a first connection portion 710 and a second connection portion 720 which will be described below. For example, the crucible 310 may extend (e.g., may have a long side that extends) along one direction, e.g., the first direction T.

The heater 400 may be disposed on or at an upper portion of the crucible 310 such that the heater 400 faces the lower portion of the crucible 310 to apply heat to the deposition material M. For example, the heater 400 may include a plurality of first heaters 410 (refer to FIG. 3A) and a plurality of second heaters 420 (refer to FIG. 3A). In an implementation, the plurality of first heaters 410 may extend along one direction, e.g., the lengthwise or long direction of the crucible 310, and may be disposed or arranged side by side such that the plurality of first heaters 410 are separated from each other with a predetermined interval or pitch. The plurality of second heaters 420 may extend in a direction perpendicular to the one direction, and may be disposed or arranged side by side such that the plurality of second heaters 420 are separated from each other with a predetermined interval or pitch. The heater 400 may be formed of or include, e.g., a heat emission coil, and may be on or at the upper portion of the crucible 310 to apply heat to the deposition material M disposed on or at the lower portion of the crucible 310 as described above.

A temperature controller 430 may be a control unit that controls a heat emission degree of the heater 400, and may include, e.g., a storage medium 431, a processor 433, an input/output (I/O) interface 434, and a temperature detector 435. The storage medium 431 may store data representing a relation between temperature of the heater 400 and a formed layer thickness of the deposition material M or a program for feedback-controlling the heater, etc. The temperature detector 435 is a detection member that may measure the inner temperature of the crucible 310. The processor 433 may calculate a generation speed of a gas molecule of the deposition material M by using an input signal input to the I/O interface 434 using various data or the program stored in the storage medium 431 and the inner temperature of the crucible 310 detected by the temperature detector 435, and calculate a voltage applied to the heater 400 from the calculated generation speed. The processor 433 may transmit a temperature control signal to a power unit, and the power unit may apply a desired voltage to each heater based on the temperature control signal transmitted from the processor 433.

The evaporator 300 may be connected with the linear deposition source 200 through a plurality of connection portions 700. For example, the first connection portion 710 and the second connection portion 720 may be disposed on or at sides, e.g., both side portions, of the crucible 310 with a predetermined interval or space therebetween. The linear deposition source 200 and the evaporator 300 may be connected with each other by the first connection portion 710 and the second connection portion 720. Accordingly, the deposition material M that is evaporated from or in the evaporator 300 may be transferred to the linear deposition source 200 via the first connection portion 710 and the second connection portion 720.

The evaporator 300 may further include a first valve 340 (that controls whether an evaporated deposition material is supplied to the first connection portion 710 and the second connection portion 720), a second valve 350 (that controls whether the deposition material is supplied to the crucible 310), and a gas supplier 360.

The first valves 340 may be disposed at the first connection portion 710 and the second connection portion 720, respectively, and it is possible to control whether to supply the deposition material M to the first process chamber 100 by controlling opening/closing of the first valve 340. The second valve 350 may be disposed between a raw material storage 351 and the crucible 310. It is possible to control whether to supply a raw material (for forming a layer) to the crucible 310 by controlling opening/closing of the second valve 350.

The gas supplier 360 that connects the inside of a second process chamber 100 with the inside of the crucible 310 may be disposed to the crucible 310. The gas supplier 360 may supply an inert gas (e.g., an Ar gas) from a gas supply source to the inside of the crucible 310. The supplied insert gas may serve as a carrier gas for carrying the deposition material M inside the crucible 310 up to the linear deposition source 200 via the plurality of connection portions 700. In an implementation, the deposition material M may be moved up to the linear deposition source 200 via the plurality of connection portions 700 even without a separate carrier gas. Hereinafter, for convenience in description, the deposition material M including a carrier gas is generally called a deposition material M.

Figure 3A:
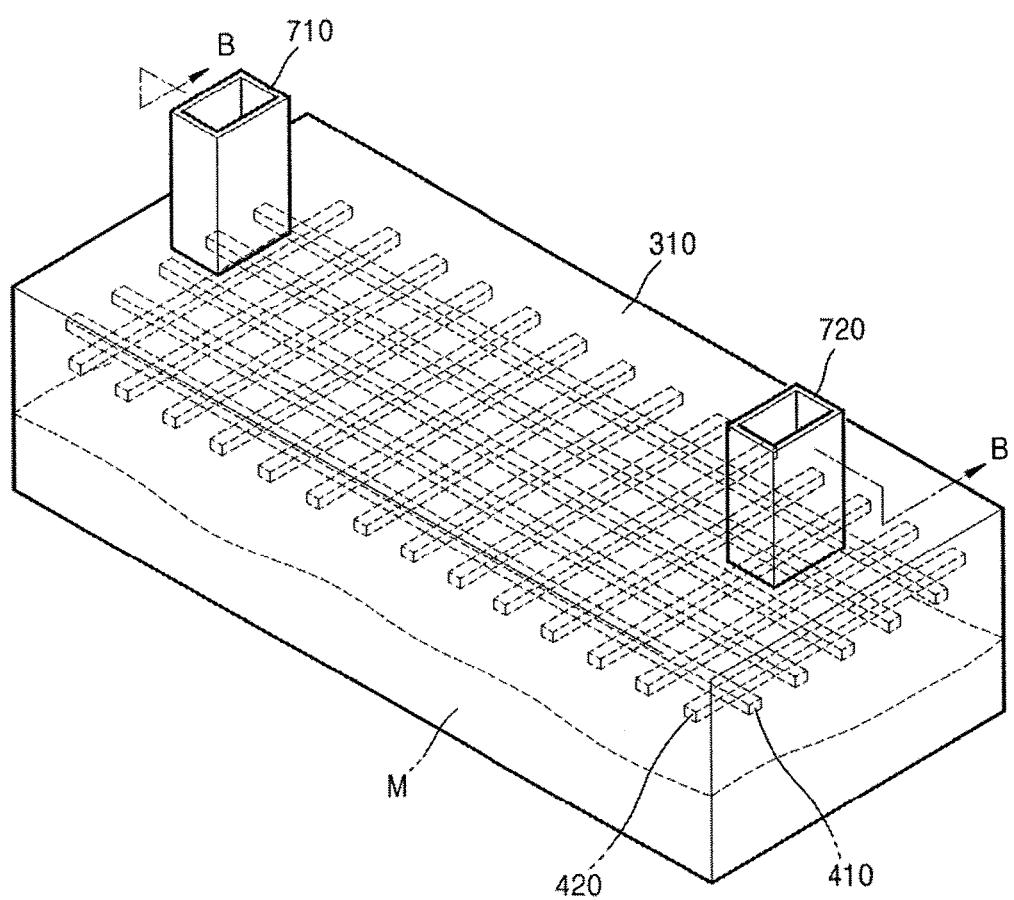
FIG. 3A illustrates a schematic perspective view of an evaporator, a first connection portion, and a second connection portion.
Figure 3B:
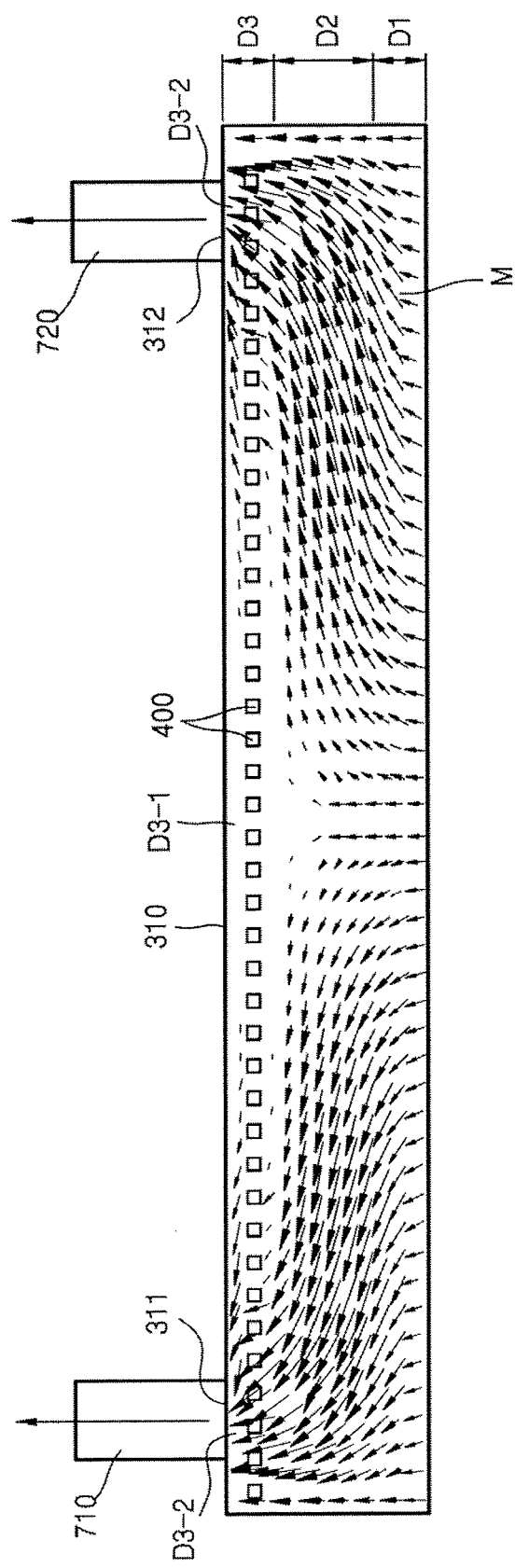
FIG. 3B illustrates a cross-sectional view of the evaporator, the first connection portion, and the second connection portion of FIG. 3A, taken along a line B-B.

FIG. 3A illustrates a schematic perspective view of an evaporator 300, a first connection portion 710, and a second connection portion 720. FIG. 3B illustrates a cross-sectional view of the evaporator 300, the first connection portion 710, and the second connection portion 720 of FIG. 3A, taken along a line B-B.

The deposition material M may pass through the connection portions 710 and 720 to move from the evaporator 300 to the linear deposition source 200 in the deposition apparatus 10 where the linear deposition source 200 and the evaporator 300 have been separated, and a pressure difference may occur between a region adjoining or adjacent to the connection portions 710 and 720 and a region not adjoining or adjacent to the connection portions 710 and 720. Accordingly, flowage (e.g., fluid flow) of the deposition material M inside or within the crucible 310 may not be constant, and degeneration of the deposition material M may occur.

For example, referring to FIGS. 3A and 3B, first heaters 410 and second heaters 420 may cross each other at the upper portion of the crucible 310 to apply heat to the deposition material M. In an implementation, the first heaters 410 and the second heaters 420 may be disposed uniformly along the upper surface of the crucible 310. Accordingly, the first heaters 410 and second heaters 420 may apply constant heat, e.g., heat of about 200-500° C. to all regions of the deposition material M facing the first heaters 410 and the second heaters 420.

The deposition material M may be evaporated by the first heater 410 and the second heater 420. In an implementation, constant heat may be applied to the deposition material M by the first heater 410 and the second heater 420, and an evaporating speed of the deposition material M may be maintained constant along the length direction of the crucible 310. For example, the deposition material M may be evaporated at a constant speed in a first region D1 (that is adjoining or adjacent to the surface of the deposition material M). Thus, the evaporated deposition material M may be raised all over or above the first region D1.

The evaporated deposition material M may be raised up to a third region D3 (that is adjoining or adjacent to the upper surface of the crucible 310). As described above, the deposition material M may be constantly raised via the first opening 311 and the second opening 312 connected with the first connection portion 710 and the second connection portion 720, respectively, at ends, e.g., both ends, of the third region D3. However, flowage or fluid flow of the deposition material M disposed between the first opening 311 and the second opening 312 may be blocked by the upper surface of the crucible 310, so that the flowage thereof may stagnate. Accordingly, the pressure of a region D3-2 (corresponding or aligned with the first opening 311 and the second opening 312) may be smaller than that of a region D3-1 (between the first opening 311 and the second opening 312).

Depending on a pressure difference between the region D3-1 and the region D3-2, the flowage direction of the deposition material M in the first region D1 may change from the second region D2 (between the first region D1 and the third region D3) to the region D3-2. For example, the pressure of the region D3-2 may be smaller than that of the region D3-1, and not only the flowage direction of the deposition material M evaporated from or at ends, e.g., both ends, of the first region D1, but also the flowage direction of the deposition material M evaporated from or at the central portion of the first region D1 may change or be redirected toward the region D3-2 (whose pressure is relatively small).

On the contrary, a first pressure of the region D3-1 may be relatively high, when compared to a second pressure of the region D3-2, a new deposition material M evaporated from the first region D1 may not be introduced to the region D3-1, and an already disposed deposition material M may remain in the region D3-1. Accordingly, the deposition material M remaining in the region D3-1 could degenerate or degrade. If the degenerated or degraded deposition material M were to be deposited on the substrate G, purity deterioration of a formed layer may result, so that a defect of a display apparatus could occur.

Figure 4A:
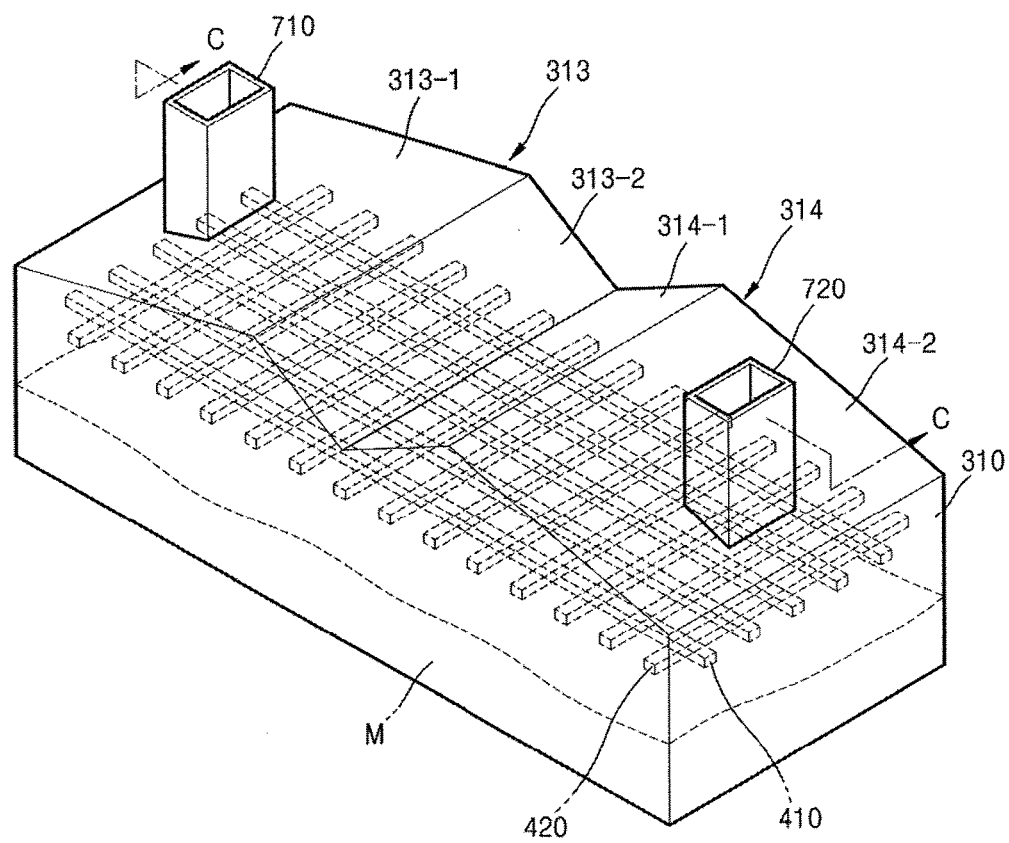
FIG. 4A illustrates a schematic perspective view of an evaporator, a first connection portion, and a second connection portion according to an exemplary embodiment.
Figure 4B:
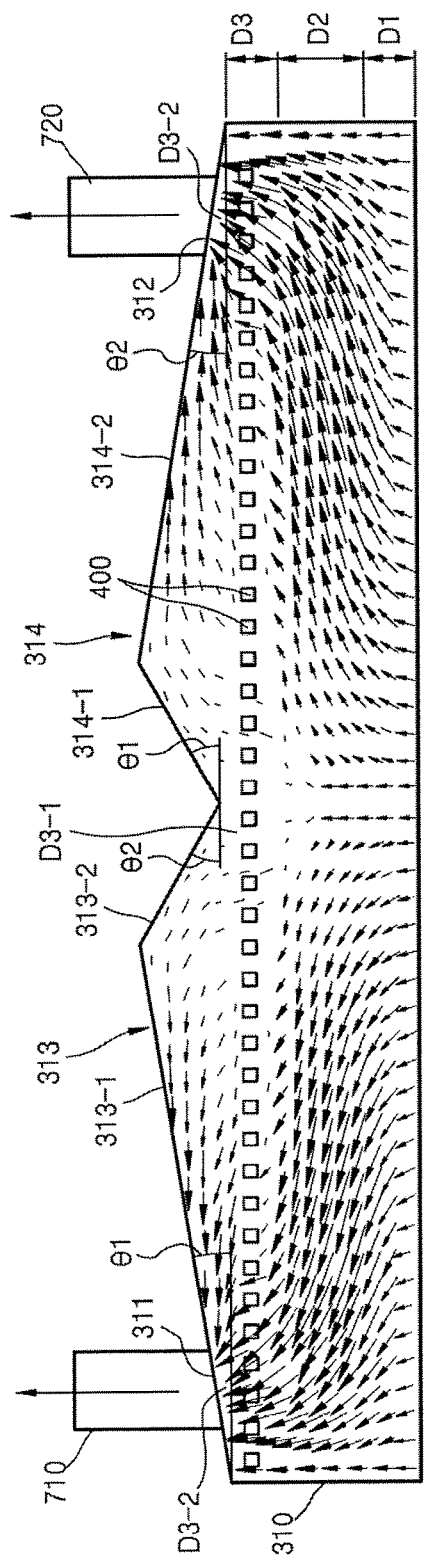
FIG. 4B illustrates a cross-sectional view of the evaporator, the first connection portion, and the second connection portion of FIG. 4A, taken along a line C-C.
Figure 5A:
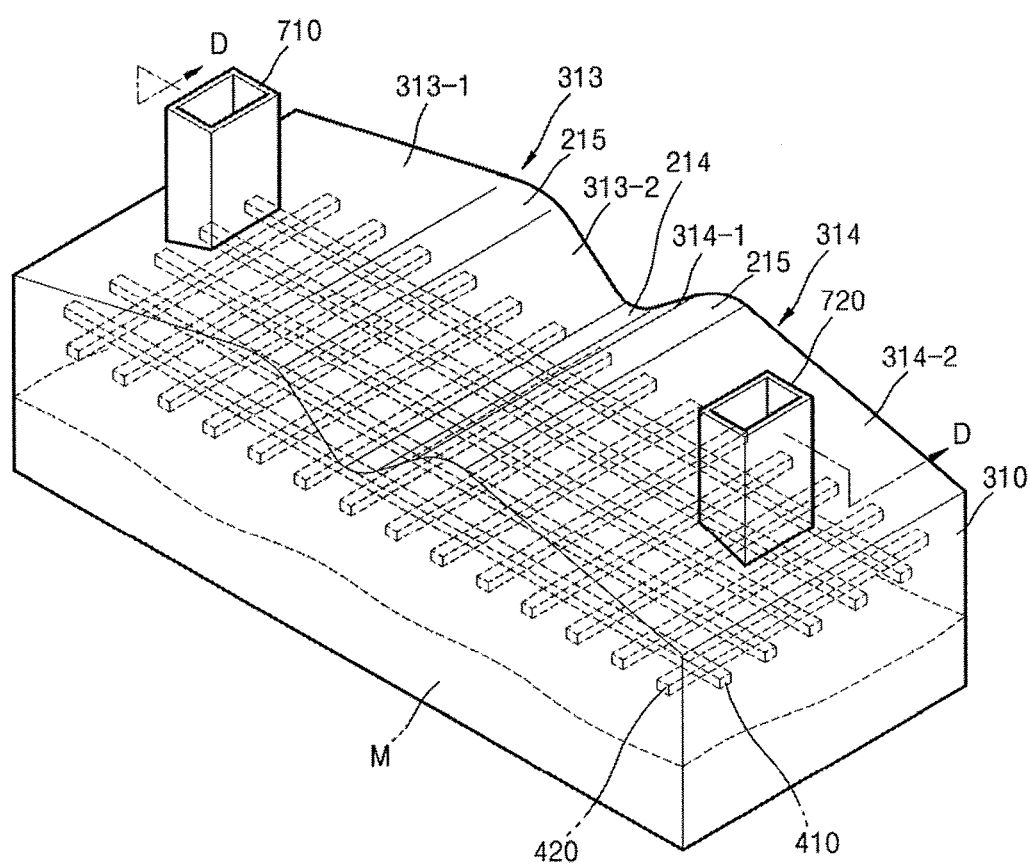
FIG. 5A illustrates a schematic perspective view of an evaporator, a first connection portion, and a second connection portion according to another exemplary embodiment.
Figure 5B:
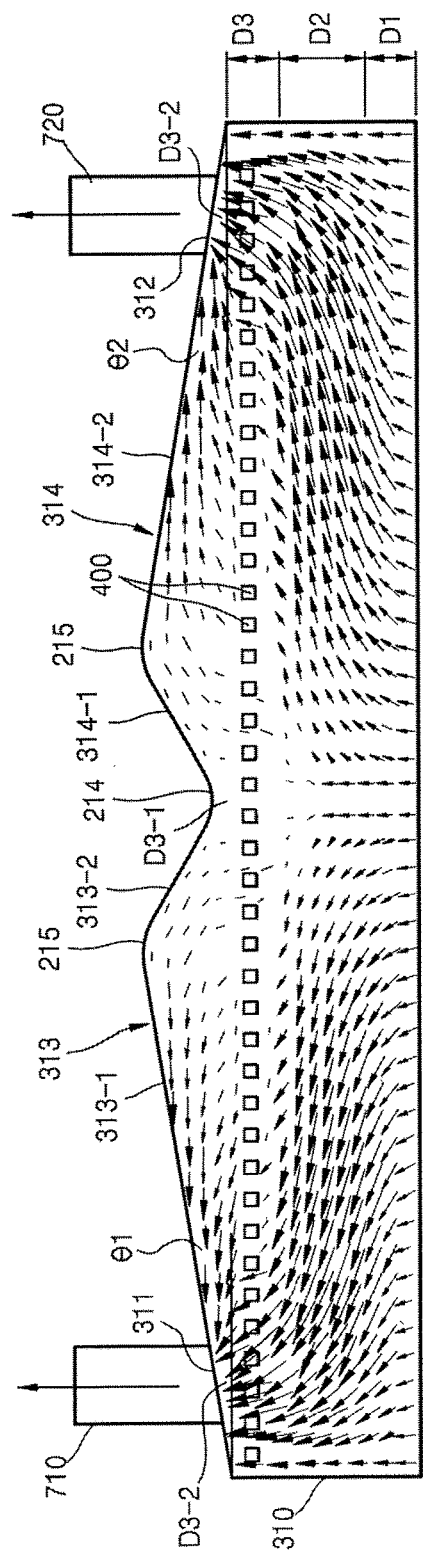
FIG. 5B illustrates a cross-sectional view of the evaporator, the first connection portion, and the second connection portion of FIG. 5A, taken along a line D-D.

FIG. 4A illustrates a schematic perspective view of an evaporator 300, a first connection portion 710, and a second connection portion 720 according to an exemplary embodiment. FIG. 4B illustrates a cross-sectional view of the evaporator 300, the first connection portion 710, and the second connection portion 720 of FIG. 4A, taken along a line C-C. FIG. 5A illustrates a schematic perspective view of an evaporator 300, a first connection portion 710, and a second connection portion 720 according to another exemplary embodiment. FIG. 5B illustrates a cross-sectional view of the evaporator 300, the first connection portion 710, and the second connection portion 720 of FIG. 5A, taken along a line D-D.

As described above, the deposition material M may remain in the region D3-1 due to a pressure distribution difference of the third region D3. In an implementation, the pressure distribution of the third region D3 may be adjusted or controlled by changing a shape of the upper surface of the crucible 310, and flowage of the deposition material M within, into, and/or out of the region D3-1 may be generated or ensured.

Referring to FIGS. 4A and 4B, the upper surface of the crucible 310 may include a first convex portion 313 and a second convex portion 314 successively disposed between the first connection portion 710 and the second connection portion 720. For example, the first convex portion 313 and the second convex portion 314 may extend along a widthwise (e.g., short side) direction of the crucible 310, and may be symmetrically disposed between the first connection portion 710 and the second connection portion 720. For example, the first convex portion 313 and the second convex portion 314 may have first inclination portions 313-1, 314-1, and second inclination portions 313-2, 314-2 inclined to form a predetermined angle with respect to the length direction of the crucible 310. For example, the first inclination portions 313-1, 314-1 (e.g., the first inclination portion 314-1) may be plate-shaped members inclined (e.g., counterclockwise or in one direction) by or at a first angle θ1, e.g., about 20-60° with respect to a line or plane extending along the length direction of the crucible 310. The second inclination portions 313-2, 314-2 (e.g., the second inclination portion 313-2) are plate-shaped members inclined (e.g., clockwise or in another direction) at a second angle θ2, e.g., about 20-60° with respect to a line or plane extending along the length direction of the crucible 310. For example, the first inclination portion 314-1 may form a first angle θ1 with respect to a plane extending along the length direction of the crucible 310. For example, the second inclination portion 313-2 may form a second angle θ2 (that faces a direction opposite to the first angle θ1) with respect to a plane extending along the length direction of the crucible 310. In an implementation, another angle may be formed between the first inclination portion 314-1 and the second inclination portion 314-2 to direct flow of the evaporated material M from the region D3-1 toward the second connection portion 720. In an implementation, another angle may be formed between the first inclination portion 313-1 and the second inclination portion 313-2 to direct flow of the evaporated material M from the region D3-1 toward the first connection portion 710.

The first convex portion 313 and the second convex portion 314 may be in a region D3-3 and a region D3-4 between the region D3-1 and the region D3-2, and the region D3-3 and the region D3-4 may secure a relatively large space between the heater 400 and the upper surface of the crucible 310 (compared to the region D3-1). Accordingly, in the case where the deposition material M having the same flowing speed is introduced to the region D3-1, the region D3-3, and the region D3-4, a third pressure P3 and a fourth pressure P4 of the region D3-3 and the region D3-4 may be smaller than the first pressure of the region D3-1.

Depending on a pressure difference between the region D3-1 and the region D3-3 and the region D3-4, the deposition material M introduced to the region D3-1 may move up to the region D3-2 along the region D3-3 and the region D3-4. Therefore, the deposition material M introduced to the region D3-1 may move up to the region D3-2, and may be transferred to the linear deposition source 100 via the first connection portion 710 and the second connection portion 720. Accordingly, the deposition material M introduced to the region D3-1 may not stagnate or remain in the region D3-1, and degeneration and/or degradation of the deposition material M may be reduced and/or prevented.

The shape of a first joining portion 214 between the first convex portion 313 and the second convex portion 314, and the shape of a second joining portion 215 between the first inclination portions 313-1, 314-1 and the second inclination portions 313-2, 314-2 may change or may be selected so that flowage of the deposition material M that occurs between the region D3-1 and the region D3-2 may be performed more easily.

Referring to FIGS. 5A and 5B, the first joining portion 214 and the second joining portion 215 may be formed in or as a curved surface shape extending along the widthwise direction of the crucible 310. In the case where the deposition material M is introduced to the region D3-1, flowage of the deposition material M may be performed or may occur along the curved surface shape of the first joining portion 214 and the second joining portion 215. Accordingly, the deposition material M may be transferred up to the region D3-2 more easily, e.g., without stagnation in the region D3-1, and degeneration of the deposition material introduced to the region D3-1 may be reduced and/or prevented.

Figure 6:
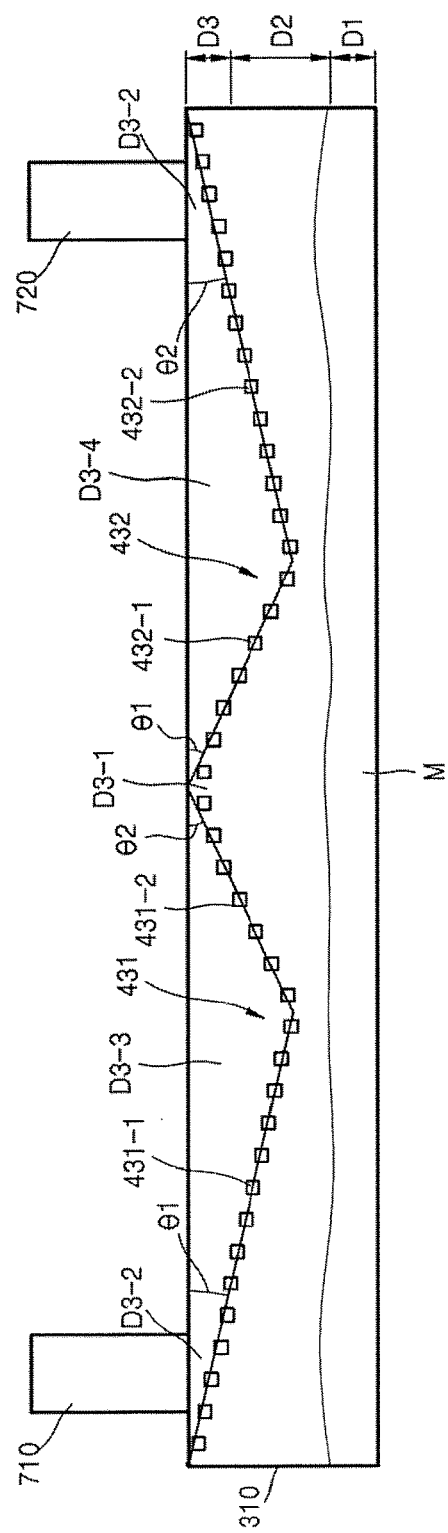
FIG. 6 illustrates a schematic cross-sectional view of an evaporator, a first connection portion, and a second connection portion according to another exemplary embodiment.

FIG. 6 illustrates a schematic cross-sectional view of an evaporator 300 and a first connection portion 710 and a second connection portion 720 according to another exemplary embodiment. For convenience in description, repeated descriptions of the same configuration as FIGS. 4A and 4B may be omitted.

As described above, the deposition material M could remain and/or stagnate in the region D3-1 due to a pressure distribution difference of the third region D3. In an implementation, flowage of the deposition material M introduced to, out from, and/or into the region D3-1 may be generated or occur not only due to a change in the shape of the upper surface of the crucible 310, but also in the case of changing a pressure distribution of the third region D3 by changing a shape of the heater 400.

Referring to FIG. 6, the heater 400 may face the upper surface of the crucible 310, and may include a first concave portion 431 and a second concave portion 432 between the first connection portion 710 and the second connection portion 720. For example, the first concave portion 431 and the second concave portion 432 may be symmetrically disposed or aligned between the first connection portion 710 and the second connection portion 720, and may include first inclination heater portions 431-1, 432-1 and second inclination heater portions 431-2, 432-2 inclined to form a predetermined angle with respect to the lengthwise direction of the crucible 310. For example, the first inclination heater portions 431-1, 432-1 may have a lattice structure of first heaters 410 and second heaters 420 disposed such that the first inclination heater portions 431-1, 432-1 are inclined (e.g., clockwise or in one direction) at a first angle $\theta 1$ with respect to a line or plane extending along the lengthwise direction of the crucible 310. The second inclination heater portions 431-2, 432-2 may have a lattice structure of the first heaters 410 and the second heaters 420 disposed such that the second inclination heater portions 431-2, 432-2 are inclined (e.g., counterclockwise or in another direction) at a second angle $\theta 2$ with respect to a line or plane extending along the lengthwise direction of the crucible 310.

The first concave portion 431 and the second concave portion 432 may be disposed in the region D3-3 and the region D3-4 between the region D3-1 and the region D3-2, and the region D3-3 and the region D3-4 may secure a relatively large space between the heater 400 and the upper surface of the crucible 310 (compared to the region D3-1). Accordingly, in the case where the deposition material M having the same flowing speed is introduced to the region D3-1, the region D3-3, and the region D3-4, a third pressure and a fourth pressure of the region D3-3 and the region D3-4 may be smaller than the first pressure of the region D3-1.

A method in which the deposition material M introduced to the region D3-1 moves up to the region D3-2 due to the pressure difference between the region D3-1 and the region D3-3 and the region D3-4 may be substantially the same as the content described in FIGS. 4A and 4B, and a repeated description thereof is omitted.

By way of summation and review, a deposition method may be implemented by using a deposition apparatus that includes among other elements an evaporator for evaporating a deposition material and a sprayer for spraying the evaporated gas molecules to form a layer on a glass substrate. In some deposition apparatuses, the evaporator and the sprayer may be disposed inside the same process chamber. Therefore, a series of processes to form a layer on the glass substrate by evaporating a deposition material inserted in the evaporator and spraying the deposition material from the sprayer to the glass substrate to allow the deposition material to adhere to the glass substrate may take place in the same process chamber.

In this case, high heat generated when evaporator operates may be transferred to parts such as sensors, etc., which thus may not operate properly or not operate at all.

If the evaporator and the sprayer are disposed in separate process chambers and the chamber where the sprayer is disposed is maintained in a vacuum state, the probability that molecules of a deposition material collides with remaining gas molecules inside the process chamber before reaching the glass substrate may be very low. Accordingly, heat generated by the evaporator may not be transferred to other parts inside the process chamber. Therefore, to maintain the degree of vacuum of the sprayer and simultaneously maintain a high temperature state of the evaporator, the evaporator and the sprayer of the deposition apparatus may be separately disposed.

In the case of a separate-type deposition apparatus including an evaporator and a sprayer separated from each other, e.g., in the case of a deposition apparatus for manufacturing large-sized display apparatuses, degradation of some deposition materials may occur due to the characteristics of gas flow from the evaporator.

A deposition apparatus according to an exemplary embodiment may include an evaporator that has improved a flowage characteristic of a deposition material, and thus may reduce degeneration or degradation of the deposition material inside the evaporator.

Also, as degeneration or degradation of the deposition material disposed inside the evaporator is reduced, forming of a layer sprayed by a sprayer, and purity of the residual may improve, so that a defect rate of a display apparatus may be advantageously lowered.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A deposition apparatus, comprising:
   a crucible to receive the deposition material and in which a deposition material is evaporated;
   a linear deposition source having a sprayer to spray the evaporated deposition material;
   a first connection portion and a second connection portion spaced apart from each other by a predetermined interval, the first connection portion and the second connection portion connecting the linear deposition source to the crucible at an upper surface of the crucible; and
   a heater in the crucible to apply heat to the deposition material,
   wherein:
   the heater faces the upper surface of the crucible and includes a first concave portion and a second concave portion successively formed between the first connection portion and the second connection portion, the crucible extends lengthwise in one direction, and the first concave portion and the second concave portion each include:
- a first inclination heater portion inclined at a first angle with respect to the one direction, and
- a second inclination heater portion inclined at a second angle with respect to the one direction.

2. The apparatus as claimed in claim 1, wherein:

the first inclination heater portion and the second inclination heater portion each include a plurality of first heaters and a plurality of second heaters, the plurality of first heaters extend in one direction and are arranged next to each other to be separated from each other by a predetermined interval, and the plurality of second heaters extend in a direction perpendicular to the one direction and are arranged next to each other to be separated from each other by a predetermined interval.

* * * * *